Sept. 29, 1964 P. E. LA BEAUME 3,151,236
ELECTRONIC COUNTER CIRCUIT USING DIODE MATRIX
Filed April 11, 1962
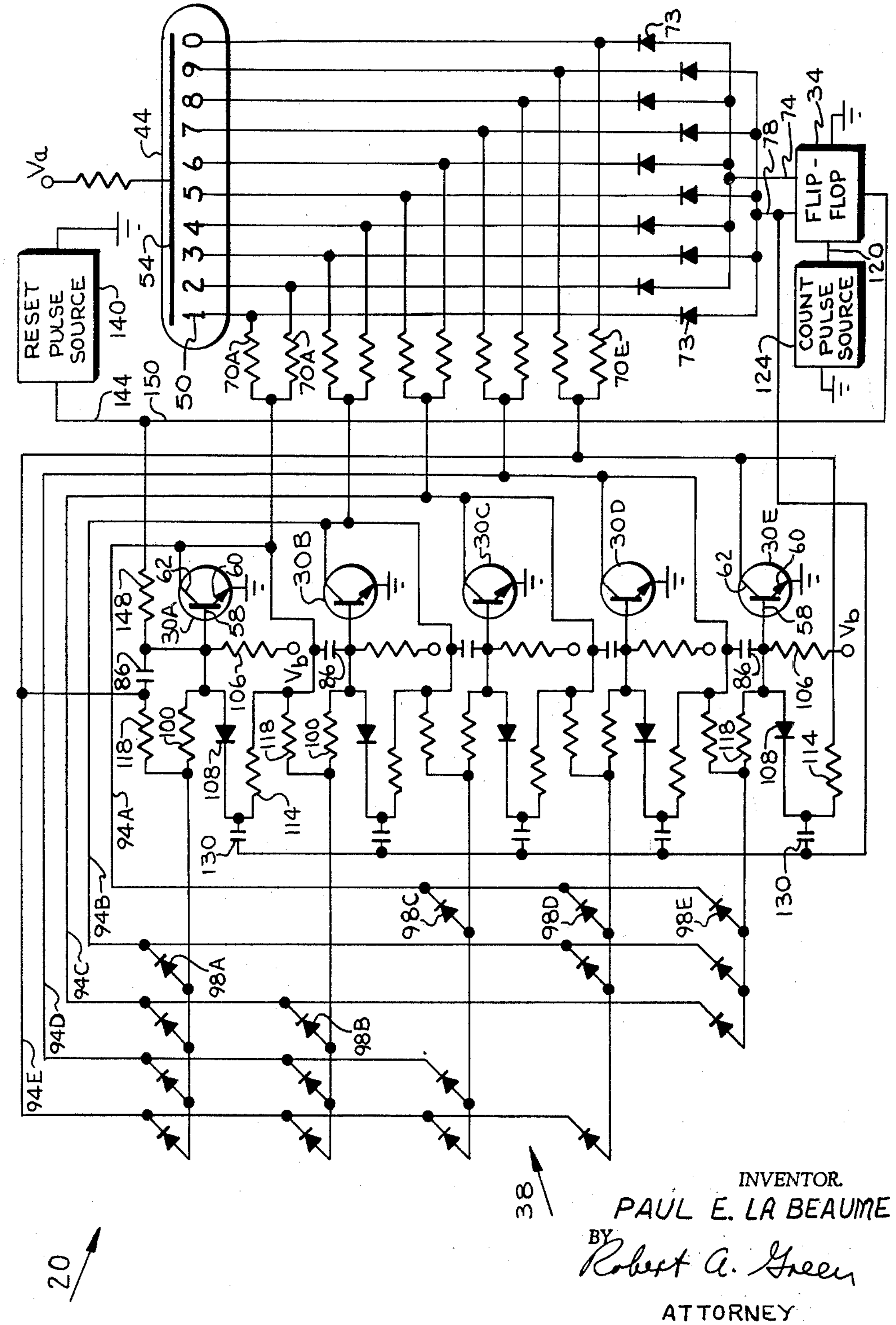
INVENTOR.
PAUL E. LA BEAUME
BY Robert A. Green
ATTORNEY

United States Patent Office 3,151,236

Patented Sept. 29, 1964

3,151,236

ELECTRONIC COUNTER CIRCUIT USING DIODE MATRIX

Paul E. La Beaume, Livingston, N.J., assignor to Burroughs Corporation, Detroit, Mich., a corporation of Michigan Filed Apr. 11, 1962, Ser. No. 186,698
5 Claims. (Cl. 235—92)

This invention relates to electronic counter circuits and particularly to semiconductor counter circuits which include a diode matrix and which provide direct decimal representation of the counting operation which is performed by binary-type circuit elements.

One type of electronic semiconductor counter recently devised utilizes a diode matrix to transmit counting signals to a plurality of transistors, or the like, one transistor being provided for each counting step to provide decimal output logic. Such a circuit can be coupled directly to a decimal readout or indicator device to provide a direct visual indication of the counting operation. In this case, the readout device has one indicator element for each separate source of signal information. This type of circuit operates quite satisfactorily.

Another counter circuit using a diode matrix combines binary-type circuit elements with a binary-type readout device to obtain a decimal indication of the counting operation. This circuit operates satisfactorily and is somewhat simpler than the first-mentioned counter.

The present invention provides a counter circuit using a diode matrix and coupling binary-type circuit counting element directly to a decimal readout device. Such a circuit combines the advantage of using a relatively small number of parts with the advantage of using a decimal readout device which is somewhat easier to make than its binary counterpart.

The objects of the present invention concern the provision of a relatively simple and inexpensive semiconductor counter utilizing a diode matrix and combining a binary-type counting circuit directly with a decimal readout device to provide a direct decimal representation of the counting operation.

Briefly, a counter circuit embodying the invention includes a cold cathode gaseous indicator tube having an anode and one or more pairs of cathode indicator glow electrodes. A discharge device, which operates in the nature of a switch, is provided to control the operation of each pair of cathodes, and an auxiliary control means is provided for actuating each discharge device and the pair of glow cathodes associated therewith. Thus, the control means actuates a discharge device to determine which pair of cathodes is energized and then separately energizes each of the cathodes of the pair to exhibit cathode glow.

The discharge devices are adapted to be energized to assume a unique state of conduction; that is, they may operate a pair of cathodes by being turned either on or off. Circuit means are provided by which each discharge device, as it is turned on or off, holds all of the other discharge devices in the opposite state. In addition, the circuit connections insure that the counting operation proceeds automatically in the correct direction and in the correct order from one discharge device to the next.

The invention is described in greater detail by reference to the single figure of the drawing which is a schematic representation of a counter circuit embodying the invention.

The principles of the present invention are described below with reference to a decade counter circuit which, to provide a cycle of ten counts, includes five circuit logic elements which operate in the nature of switches and perform a binary type of operation. The switch elements are electron discharge devices, preferably semiconductor devices, which are directly coupled to a readout device having ten indicator elements arranged in pairs, with each pair being operated by one of the semiconductor devices. It will be clear to those skilled in the art that the circuit may include substantially any number of discharge devices and the indicator device may include any corresponding number of pairs of indicator elements, if it is desired to provide other than a decade counter.

Referring to the drawing, a decade counter circuit 20 embodying the invention includes five electron discharge devices, 30A, 30B, 30C, 30D, 30E, preferably semiconductor devices such as transistors, which receive separate counting pulses from a flip-flop 34 and are interrelated through a diode matrix 38. The transistors are shown and described as NPN transistors, but it is clear that other types of devices could be used. The transistors are coupled to a cold cathode gaseous indicator tube 44 which provides a decimal representation of the counting operation, and it is assumed that the counting operation proceeds in order from transistor 30A to 30B to 30C, etc. The tube 44 may be a type 6844A tube and includes ten indicator cathodes 50, which include numerals "0" to "9" and an anode 54 which is suitably connected to a positive D.C. power supply V*a*.

Each transistor has base, emitter, and collector electrodes, 58, 60, and 62, respectively, and, in each transistor, the emitter electrode 60 is connected to reference potential such as ground. Each collector electrode is connected to a pair of indicator cathodes of the indicator tube 44. Thus, the collector or output electrode 62 of transistor 30A is coupled through separate resistors 70A to numerically adjacent cathodes "1" and "2." Similarly, the collector of transistor 30B is coupled through resistors 70B to cathode numerals "3" and "4," etc.

In addition, each cathode is connected to the cathode of a diode 73, the anode of which is coupled to one of the output lines 74 and 78 of flip-flop 34.

The cathode electrodes are connected to the flip-flop in two sets, with the odd numbers in one set and the even numbers in the other set. The even number cathodes are coupled to output line 74, for example, and the odd number cathodes are coupled to output lines 78.

Referring again to the semiconductor devices 30A to 30E, each collector electrode 62 is coupled through a capacitor 86 to the base electrode 58 of the next adjacent higher order transistor in the counting order. Each collector is also coupled through a diode 98 back to each base electrode except its own and except that of the next adjacent transistor in the counting order. Thus, the collector of transistor 30A is coupled by lead 94A to the cathodes of diodes 98C, 98D, and 98E, the anodes of which are each connected through resistors 100 to the base electrodes of transistors 30C, 30D, and 30E. The collector of transistor 30B is similarly coupled by lead 94B through diodes 98A, 98D, 98E, and resistors 100 to the base electrodes of transistors 30A, 30D, and 30E, etc.

The base electrode 58 of each transistor is also connected through a suitable bias resistor 106 to a source of negative D.C. bias potential V*b*. Each base electrode is also connected to the anode of a diode 108, the cathode of which is connected through resistor 114 back to its own collector electrode.

As part of the voltage biasing arrangement for each transistor, a resistor 118 is provided between resistor 114 and resistor 100 so that, in effect, a bleeder network is provided for each transistor extending from source V*c* through resistors 68, 118, 100, and 106 to V*b*.

The flip-flop 24 may be of conventional construction and includes a single input 120 which is coupled to a source 124 of counting pulses. In addition to the connection of the output lines 74 and 78 described above, one of the output lines, for example 78, is also coupled through a separate capacitor 130 and through each diode 108 to the base electrode of each transistor.

The circuit also includes means for resetting the counter to "0" position and for properly resetting the flip-flop. This means includes a source 140 of positive reset pulses having its output 144 coupled through a resistor 148 to the base electrode of transistor 30A. The output of the reset pulse source is also suitably coupled to the flip-flop 34 by a lead 150 to properly set the flip-flop to coincide with the turning on of transistor 30A. Such a setting provides a generally positive potential on lead 74 and a generally negative potential on lead 78.

In operation of the circuit 20, the counter is set in operation by forcing on the first transistor 30A and setting the flip-flop to provide a positive potential on the output 74 of the flip-flop and a generally negative potential on lead 78 of the flip-flop. When transistor 30A is turned on, its collector is reduced to about ground potential, and this potential tends to be applied to both numeral cathodes "1" and "2" of tube 44. However, output lead 74 of flip-flop 34 holds cathode numeral "2" at a positive potential which is too high to allow cathode "2" to exhibit cathode glow. Thus, the ground potential applied to cathode "1" causes it to exhibit cathode glow. At the same time, the ground potential on collector 62 of transistor 30A is coupled through the resistors 118 and 100 to the base electrode of transistor 30B which is thereby held off, and this same potential is also coupled through lead 40A and diodes 98 to the base electrodes of the other transistors 30C, 30D, and 30E, which are held off thereby.

When the next counting pulse from source 124 is applied to the flip-flop 34, the potentials on the output leads 74 and 78 are reversed and output lead 78 becomes generally positive and output lead 74 becomes generally negative. Since the output lead 74 is not connected to any of the transistors and transistor 30A is already conducting, the transistors are not affected and their states are not changed. However, the change in flip-flop output potentials now applies a generally positive potential to cathode numeral "1" which is thereby extinguished, and cathode numeral "2" can now assume ground potential and exhibits cathode glow. The next counting pulse applied to the flip-flop 34 returns lead 74 to a positive potential and lead 78 to a negative potential. The negative pulse coupled through the capacitor 130 to the base electrode of transistor 30A turns off this transistor and causes its collector electrode 40 to rise to a positive potential. This positive potential is coupled through capacitor 86 to the base electrode of transistor 30B, which is thus caused to turn on. When transistor 30B is turned on, its collector electrode 40 is reduced to about ground potential, as are cathodes "3" and "4". Since a positive potential is present on lead 74, cathode numeral "4' cannot glow but a generally negative potential on flip-flop lead 78 places cathode numeral "3" at a sufficiently low potential that it can exhibit cathode glow. The next counting pulse applied to the flip-flop reverses the potentials on the leads 74 and 78 and causes cathode numeral "4" to glow without affecting the transistors. In this manner, each input pulse applied to the flip-flop causes one after the other of the indicator cathodes to glow in order.

What is claimed is:

1. A counting circuit including
a plurality of count registering devices coupled together in series to comprise steps in a counting chain,
each count registering device including an input electrode and an output electrode,
circuit means coupling the output electrode of each device to the input electrode of every other device in the counting chain whereby each device, as it registers a count, prevents all other devices from registering a count,
a cold cathode gaseous indicator tube including an anode and a plurality of glow cathode indicator electrodes,
said glow cathode electrodes being connected in pairs with each pair of cathodes being connected to the output electrode of one of said count registering devices,
a flip-flop pulse generator having first and second output leads, one output lead being coupled both to the input electrode of each count registering device and to one glow cathode in each pair of cathodes, the other output lead of said flip-flop being coupled to the other glow cathode of each pair of cathodes,
whereby in each cycle of operation of said flip-flop, in one state of the flip-flop, said one output lead energizes one count registering device and one glow cathode of a pair and with the same count registering device still energized, when the flip-flop changes state, said other output lead energizes the other glow cathode of the pair.

2. A counting circuit including
a plurality of count registering devices coupled together in series to comprise steps in a counting chain,
each count registering device including an input electrode and an output electrode,
the output electrode of each device being coupled through a diode matrix to the input electrode of every other device except the next adjacent device in the counting chain, the output electrode of each device also being coupled through a resistive path to the input electrode of the next adjacent device in the counting chain whereby each device, as it registers a count, prevents all other devices from registering a count,
a cold cathode gaseous indicator tube including an anode and a plurality of glow cathode indicator electrodes,
said glow cathode electrodes being connected in pairs with each pair of cathodes being connected to the output electrode of one of said count registering devices,
a flip-flop pulse generator having first and second output leads, one output lead being coupled both to the input electrode of each count registering device and to one glow cathode in each pair of cathodes, the other output lead of said flip-flop being coupled to the other glow cathode of each pair of cathodes,
whereby in each cycle of operation of said flip-flop, in one state of the flip-flop, said one output lead energizes one count registering device and one glow cathode of a pair and with the same count registering device still energized, when the flip-flop changes state, said other output lead energizes the other glow cathode of the pair.

3. The circuit defined in claim 1 wherein each count registering device comprises a transistor having emitter, base, and collector electrodes, with the base electrodes comprising the input electrode of the transistor and the collector electrode comprising the output electrode of the transistor.

4. A counter circuit comprising
a cold cathode gaseous indicator tube including a plurality of cathode indicator electrodes and an anode,
said cathodes being electrically connected in pairs,
a separate transistor coupled to each pair of cathodes for applying an operating potential to both cathodes of a pair at the same time,
a flip-flop driver coupled to said pairs of cathodes and adapted to apply different potentials to each cathode of a pair at the same time so that only one member of a pair can glow at a time,
said flip-flop also being coupled to said transistors and adapted to cause each one separately to apply said operating potential to said cathodes, each transistor including an input electrode and an output electrode, the flip-flop being coupled to the input electrode of each transistor, the output electrode of each transistor being coupled through a diode to the input electrode of each transistor except its own input and that of the next adjacent transistor in the counting chain, and the output electrode of each transistor being coupled to the input electrode of the next adjacent transistor in the counting chain whereby the count is automatically transferred from one transistor to the next.

5. A counter circuit comprising a cold cathode gaseous indicator tube including a plurality of cathode indicator electrodes and an anode, said cathodes being electrically connected in pairs, a separate transistor coupled to each pair of cathodes for applying an operating potential to both cathodes of a pair at the same time, a flip-flop driver coupled to said pairs of cathodes and adapted to apply different potentials to each cathode of a pair at the same time so that only one member of a pair can glow at a time, said flip-flop also being coupled to said transistors and adapted to cause each one separately to apply said operating potential to said cathodes, each transistor including an input electrode and an output electrode, the flip-flop being coupled to the input electrode of each transistor, the output electrode of each transistor being coupled through a diode to the input electrode of each transistor except its own input and that of the next adjacent transistor in the counting chain, and the output electrode of each transistor being coupled to the input electrode of the next adjacent transistor in the counting chain whereby the count is automatically transferred from one transistor to the next, said flip-flop including two output lines, one of which is connected to one member of each pair of cathodes and the other of which is connected both to the other member of each pair of cathodes and to the input electrodes of said transistors.

References Cited in the file of this patent

UNITED STATES PATENTS

| | | |
|---|---|---|
| 2,851,220 | Kimes | Sept. 9, 1958 |
| 2,864,962 | Jensen | Dec. 16, 1958 |
| 2,982,880 | Klipstein | May 2, 1961 |
| 3,010,651 | Hempel | Nov. 28, 1961 |
| 3,080,501 | Charbonnier | Mar. 5, 1963 |